United States Patent
Hurley et al.

(10) Patent No.: US 7,391,256 B2
(45) Date of Patent: Jun. 24, 2008

(54) SYSTEM AND METHOD FOR DC CORRECTION IN WIRELESS RECEIVERS

(75) Inventors: William Milton Hurley, Murphy, TX (US); Lup Meng Loh, Plano, TX (US); Yinong Ding, Plano, TX (US); Michael L. Brobston, Allen, TX (US); John Alexander Interrante, Richardson, TX (US)

(73) Assignee: Samsung Electronics Co., Ltd., Suwon, Kyungki-Do (KR)

( * ) Notice: Subject to any disclaimer, the term of this patent is extended or adjusted under 35 U.S.C. 154(b) by 61 days.

(21) Appl. No.: 11/522,752

(22) Filed: Sep. 18, 2006

(65) Prior Publication Data

US 2008/0079498 A1 Apr. 3, 2008

(51) Int. Cl.
*H03F 1/02* (2006.01)

(52) U.S. Cl. .......................... 330/9; 330/306

(58) Field of Classification Search .............. 330/9, 330/306, 254, 278, 303
See application file for complete search history.

(56) References Cited

U.S. PATENT DOCUMENTS

| 6,043,758 A * | 3/2000 | Snyder et al. | 340/970 |
| 6,931,373 B1 * | 8/2005 | Bhaskar et al. | 704/230 |
| 7,020,449 B2 * | 3/2006 | Shi | 455/234.1 |

* cited by examiner

*Primary Examiner*—Henry K Choe
(74) *Attorney, Agent, or Firm*—Howison & Arnott, L.L.P.

(57) ABSTRACT

The present disclosure relates generally to systems and methods for direct current (DC) correction in wireless devices. In one example, a method includes setting a cutoff frequency of a filter at a first frequency, where a signal entering the filter is attenuated based on the cutoff frequency. If a qualified change is detected in a DC component of the signal, the cutoff frequency is set at a second frequency that attenuates more of the signal than the first frequency for a defined time period. The cutoff frequency may then be set to the first frequency after the defined time period.

23 Claims, 6 Drawing Sheets

SYSTEM AND METHOD FOR DC CORRECTION IN WIRELESS RECEIVERS

BACKGROUND

Mobile communication devices include a receiver configured to receive an incoming signal. However, a direct current (DC) offset is frequently present in the signal at various stages in a receiver design. The DC offset may cause inefficient operation of the receiver or, in extreme cases, may prevent the receiver from operating at all.

To avoid the problems that may be caused by DC offset, a correction or cancellation process is generally used to remove the unwanted DC component while preserving the fidelity of the higher frequency components of the signal. Since an ideal filter (i.e., one that can remove the DC component while perfectly preserving the other frequency components) is not practical or even possible to implement, receiver designs typically include a high pass filter having a fixed cutoff frequency. The cutoff frequency may be chosen as a compromise between various requirements, including fast convergence of initial DC offset correction upon activation of the receiver (requires higher 3 dB cutoff frequency), the preservation of the fidelity of the received signal during receiver operation (requires lower 3 dB cutoff frequency), and the ability to track anticipated subsequent changes in the nature of the unwanted DC component throughout the operation of the receiver (requires varying 3 dB cutoff frequencies depending on DC levels).

However, balancing the various requirements is difficult because some of the requirements conflict with others. For example, relatively large fluctuations in DC levels generally require a high cutoff frequency response, but this requirement is at odds with the requirement to preserve the received signal fidelity. Accordingly, improvements are needed in correcting DC offsets in wireless receivers to address such difficulties.

SUMMARY

In one embodiment, a method comprises setting a cutoff frequency of a filter coupled to a mobile device receiver at a first frequency, wherein a signal entering the filter is attenuated based on the cutoff frequency. The method also detects whether a qualified change has occurred in a direct current (DC) component of the signal. The cutoff frequency is set at a second frequency for a first defined time period if a qualified change has occurred, wherein the second frequency attenuates more of the signal than the first frequency. The cutoff frequency is set to a third frequency after the first defined time period ends, wherein the third frequency attenuates less of the signal than the second frequency.

In another embodiment, a method comprises setting at least one filter to a low cutoff frequency setting, wherein the low cutoff frequency setting attenuates a portion of a signal received by a wireless receiver. The method determines whether a qualified change has occurred to a direct current (DC) component of the signal and waits for a first predefined period of time if a qualified change has occurred. The at least one filter is set to a high cutoff frequency setting after the first predefined period of time has expired, wherein the high cutoff frequency setting attenuates a larger portion of the signal than the low cutoff frequency setting. The method waits for a second predefined period of time after setting the at least one filter to the high cutoff frequency setting and sets the at least one filter to the low cutoff frequency setting after the second predefined period of time has expired.

In still another embodiment, a system comprises at least one filter, a direct current (DC) change detector, and a state machine. The at least one filter is for attenuating a signal received by a mobile device receiver based on a programmable cutoff frequency. The DC change detector is configured to monitor a DC component of the signal and send an output signal if a change in the DC component meets at least one programmable criterion. The state machine is coupled to the at least one filter and the DC change detector. The state machine is configured to set the programmable cutoff frequency to a first cutoff value or a second cutoff value based on the output signal of the DC change detector, wherein the first cutoff value attenuates less of the signal than the second cutoff value.

In yet another embodiment, a system for use with a wireless receiver is provided. The system comprises at least one filter, a direct current (DC) gain change detector, a state machine, and a plurality of executable instructions. The at least one filter has a programmable cutoff frequency. The DC gain change detector has an input of a gain value and at least one programmable change parameter and an output of a change trigger. The state machine is coupled to the filter and the DC gain change detector. The state machine includes an input of a first time period, a low cutoff frequency value, a high cutoff frequency value, and the change trigger, and an output for setting the programmable cutoff frequency to the low or high cutoff frequency value. The plurality of executable instructions include instructions for setting the programmable cutoff frequency to the low cutoff frequency value, wherein the low cutoff frequency value attenuates a portion of a signal received by the receiver. The instructions also include instructions for asserting the change trigger if a qualified change has occurred to a DC component of the signal based on the at least one programmable change parameter. The instructions also include instructions for setting the programmable cutoff frequency to the high cutoff frequency value for the first time period after the change trigger is asserted, wherein the high cutoff frequency setting attenuates a larger portion of the signal than the low cutoff frequency value. The instructions also include instructions for setting the programmable cutoff frequency to the low cutoff frequency value after the first time period has expired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
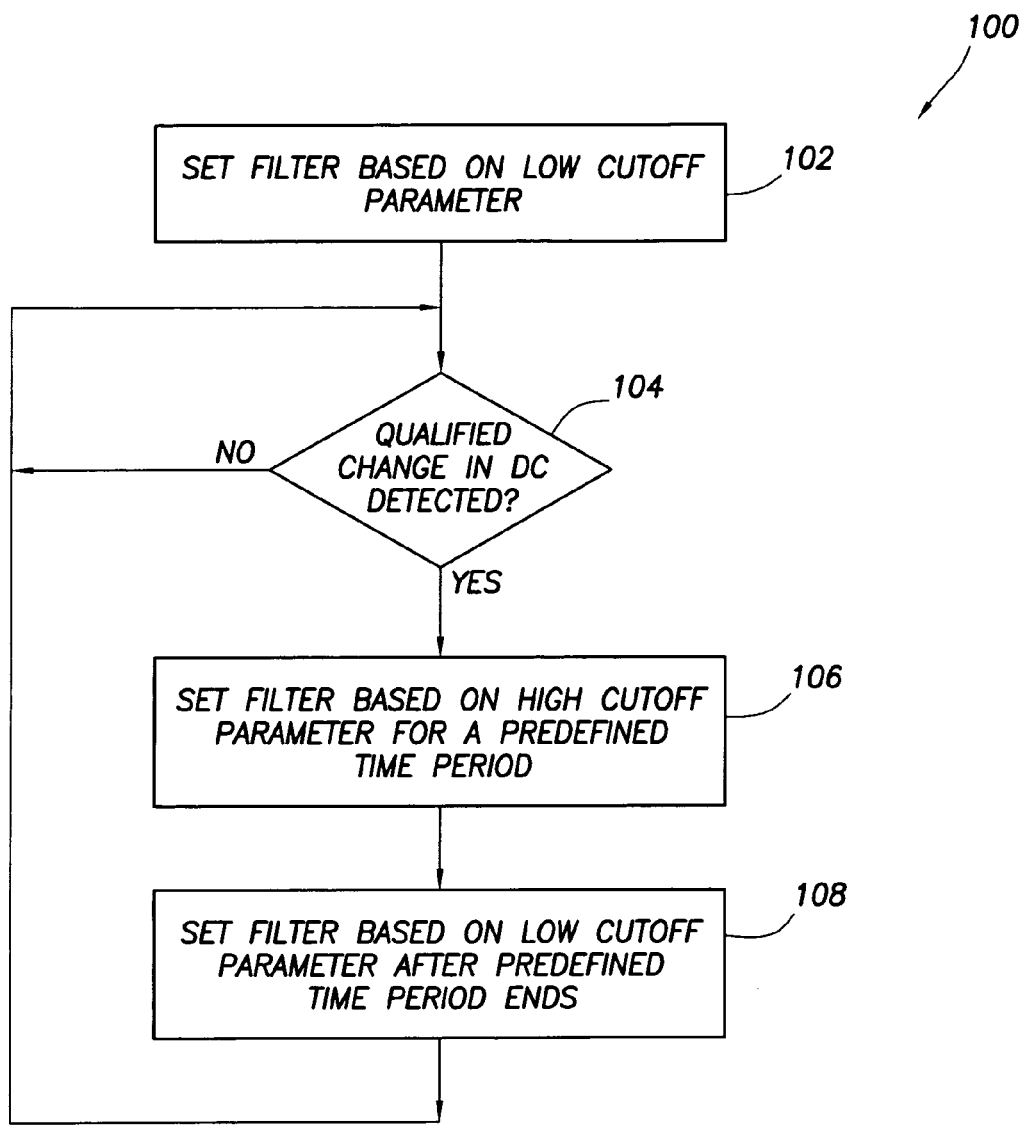
FIG. 1 is a flowchart illustrating one embodiment of a method for correcting a DC component of a signal within a mobile device.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, in one embodiment, a method 100 may be used to dynamically correct for a DC offset in a signal received by a mobile device. As the method 100 makes such corrections dynamically, performance issues related to the use of filters having fixed cutoff frequencies may be minimized or eliminated. As will be described in greater detail later, the method 100 may be used with one or more filters, such as a high pass infinite impulse response (IIR) filter.

The presence of DC offset in the signal path of a wireless receiver may be detrimental and filtering may be used in an attempt to minimize or eliminate the effect of the DC offset. The configuration of the filtering may attempt to balance various requirements, including fast convergence of initial DC offset correction upon activation of the receiver (requires higher 3 dB cutoff frequency), the preservation of the fidelity of the received signal during receiver operation (requires lower 3 dB cutoff frequency), and the ability to track anticipated subsequent changes in the nature of the unwanted DC component throughout the operation of the receiver (requires varying 3 dB cutoff frequencies depending on DC levels). For example, in a wide-band code division multiple access (WCDMA) system, one filtering implementation might use a 3 dB cutoff frequency of less than 5 KHz during normal operation to preserve received signal fidelity while using a 3 dB cutoff frequency of greater than 200 KHz when trying to rapidly converge in the presence of a large DC offset.

Receivers employed in Time Division Duplex (TDD) systems enjoy an advantage over those in Frequency Division Duplex (FDD) systems when addressing the problem of DC offset. This advantage is due to the fact that the receiver in a TDD system is activated only at predetermined timeslots of a relatively short duration instead of being activated continuously as is a receiver in an FDD system. During each timeslot, the TDD receiver may be activated for such a short period of time that changes in the nature of the DC offset may be ignored. In this case, the DC offset problem can be approached more simply by measuring and correcting the DC offset prior to each active timeslot. In contrast, the FDD receiver is in continuous operation and should be able to handle variations in DC offset levels. Accordingly, an FDD system is burdened with the additional requirement of adapting to DC offset changes after making an initial correction when activated. Additionally, due to the need to handle varying levels of DC offset, it is difficult for traditional non-adaptive approaches (e.g., filters having fixed cutoff frequencies) to be used in systems that dynamically transition between TDD and FDD operations like WCDMA FDD and Compressed Mode operation. Accordingly, the method 100 provides a dynamic approach that may be used to address such issues.

In step 102, the filter is set based on a low cutoff parameter. For example, the filter's cutoff frequency may be set using the low cutoff parameter to provide a relatively narrow notch, thereby minimizing the amount of signal distortion. In the present embodiment, step 102 may be executed at a designated time (e.g., when the mobile device is powered up).

As is known, a filter typically attenuates certain frequencies of a signal while allowing other portions to pass with little or no attenuation. The filter's passband includes the frequencies that the filter allows to pass with little or no attenuation. The width of the passband (i.e., inverse of the notch) represents the range of frequencies that are allowed to pass. For example, a wider passband (lower cutoff/narrow notch) will allow more of the signal to pass than will a narrow passband (higher cutoff/wider notch), but the narrow passband will generally remove more of the signal's DC component. However, the wider the passband, the longer it will take the filter to track changes in the DC offset. Accordingly, if the passband is too wide, there is an increased likelihood that a DC component may enter the system and destroy the signal for some period of time until the filter can track and reject the DC component. If the passband is too narrow, the filter may track more quickly but may destroy a larger part of the signal due to the increased attenuation of the desired signal. In addition, frequent widening of the notch may negatively impact the signal quality. In the present example, a low cutoff parameter for a filter indicates a narrow notch, while a high cutoff parameter indicates a notch that is relatively wide compared to the narrow notch.

In step 104, a determination may be made as to whether a qualified change in the DC component of the received signal has been detected. Due to the inherent capabilities of the high pass filter used in the present example, relatively small changes in the DC offset may be handled by the filter at its low cutoff setting. However, the filter may not be able to handle larger changes. In this embodiment, a qualified change indicates a change that the filter cannot handle at its low cutoff (e.g., narrow notch) setting. If no qualified change is detected, the method 100 may return to step 104 and repeat step 104 until a qualified change is detected.

If a qualified change is detected in step 104, the method 100 proceeds to step 106 where the filter is set based on a high cutoff parameter to provide a relatively wide notch (e.g., compared to the narrow notch of the low cutoff setting). As described previously, the wider notch provides the filter with the ability to more rapidly track the relatively large change in the DC offset and to achieve a relatively fast convergence to the changed DC offset. As has been discussed, the wider notch may result in the deterioration of the signal due to the attenuation of the desired signal. Accordingly, in the present example, the filter remains at the high cutoff setting for a predefined time period. It is understood that, in other embodiments, the time period may be dynamically defined (e.g., when a certain convergence level is reached) or may be otherwise defined.

In step 108, after the predefined time period ends, the filter is again set based on the low cutoff parameter. While this may be the same parameter as that used in step 102, other parameters may also be used as long as they are lower than the high cutoff parameter used in step 106. Setting the filter back to the relatively narrow notch continues to eliminate DC but allows more of the desired signal to pass when compared to the wider notch used in step 106. Accordingly, by switching the filter's passband between a narrow notch and a wider notch based on the detected DC component of the received signal, the method 100 may be used to achieve a fast convergence to initial DC offsets that appear immediately after receiver activation, to provide the ability to track relatively large changes in DC offsets during receiver operation, and to preserve the fidelity of the reminder of the received signal (i.e., the signal's non-DC components).

Figure 2:
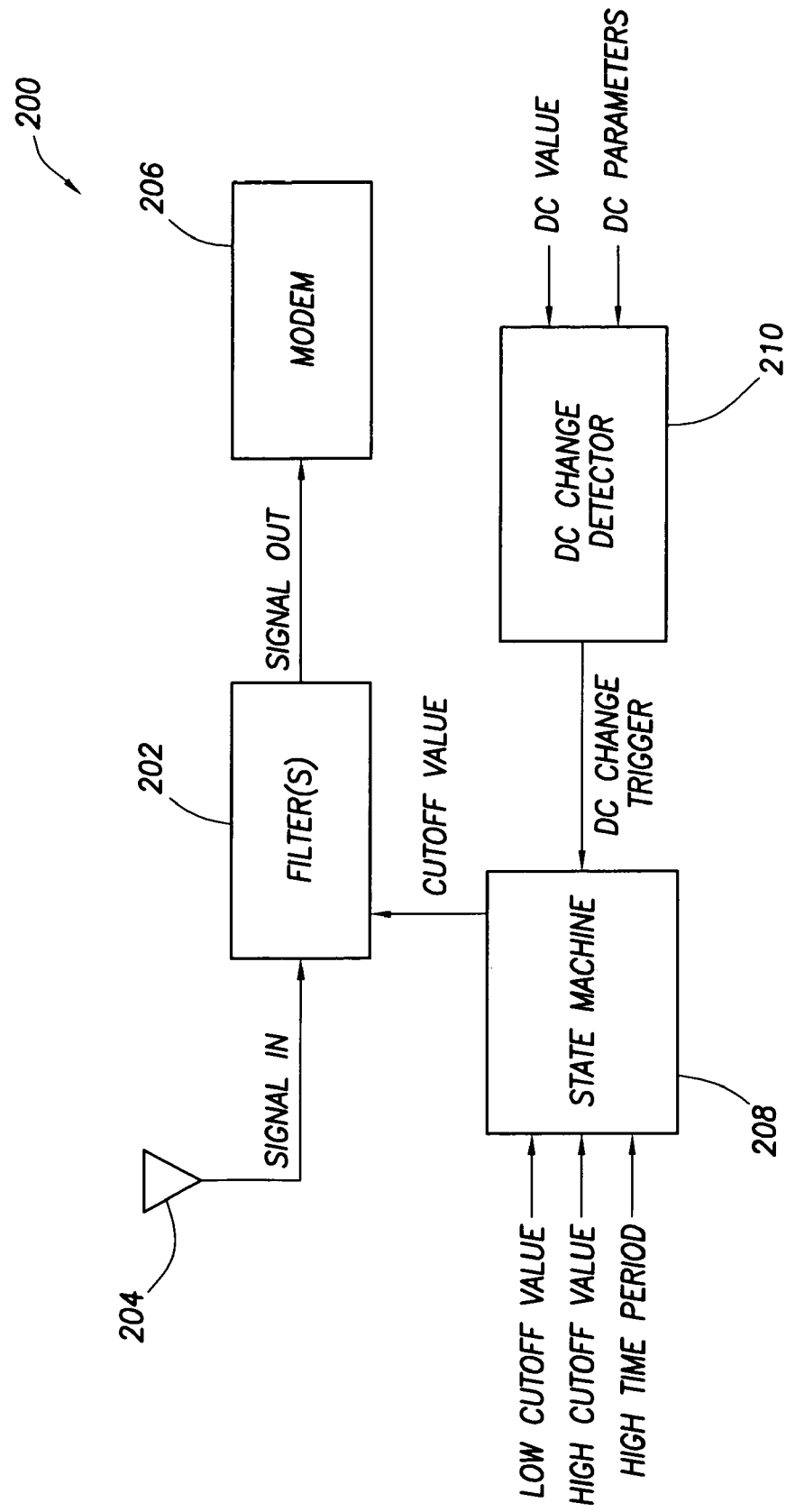
FIG. 2 is a block diagram of one embodiment of a circuit that may be used to implement the method of FIG. 1.

Referring to FIG. 2, one embodiment of a circuit 200 within which the method of FIG. 1 may be implemented is illustrated. In the present example, the circuit 200 is in a mobile communications device. As other components of such a device (e.g., receiver, transmitter, memory, and host controller/processor) are known and may vary depending on the particular implementation of the mobile device, they are not described further herein.

One or more programmable filters 202, described for purposes of convenience as a single filter, are positioned to receive an incoming signal from an antenna 204, filter the signal based on the filter's parameters (e.g., the filter's cutoff frequency), and pass the filtered signal on to another component 206 (e.g., a modem). The modem 206, which may be a digital base band modem that handles the modulation and demodulation of signals within the mobile device, may be sensitive to DC offset, so a desirable characteristic of the receive chain within which the filter 202 is positioned is to minimize or eliminate DC offset from a received signal prior to passing the signal to the modem while maintaining the fidelity of the signal. It is understood that other components (not shown) of the receive chain may be present between the filter 202 and antenna 204, and between the filter 202 and the modem 206. In the present example, the filter is an IIR high pass filter, but other filter types may be used.

Coupled to the filter 202 is a state machine 208. The state machine 208 may include multiple inputs, such as a low cutoff value, a high cutoff value, a high time period, and a DC change trigger. The state machine 208 may assign the low cutoff value and high cutoff value to the filter 202 based on the DC change trigger.

A DC change detector 210 may compare a detected DC value to one or more defined DC parameters to determine whether a qualified change in the DC offset has occurred. If a qualified change has occurred, the DC change detector 210 may signal the state machine 208, which may then set the filter's cutoff frequency to the high cutoff value as described with respect to the method 100 of FIG. 1. When the filter 202 is operating with the high cutoff value, the state machine 208 may reset the filter to the low cutoff value at the expiration of the high time period.

It is understood that the various parameters of the circuit 200, including the low cutoff value, high cutoff value, high time period, and DC parameters, may be defined as desired. For example, the actual values for each parameter may be selected based on the configuration of the mobile device and the device's known characteristics. In some examples, the parameters may be monitored and/or set by a host controller of the mobile device, rather than being defined within the circuit 200 itself. In still other embodiments, various components of the circuit 200 may be combined. For example, the state machine 208 and DC change detector 210 may be combined and the state machine 208 may then make the determination of whether a qualified gain change has occurred.

Figure 3:
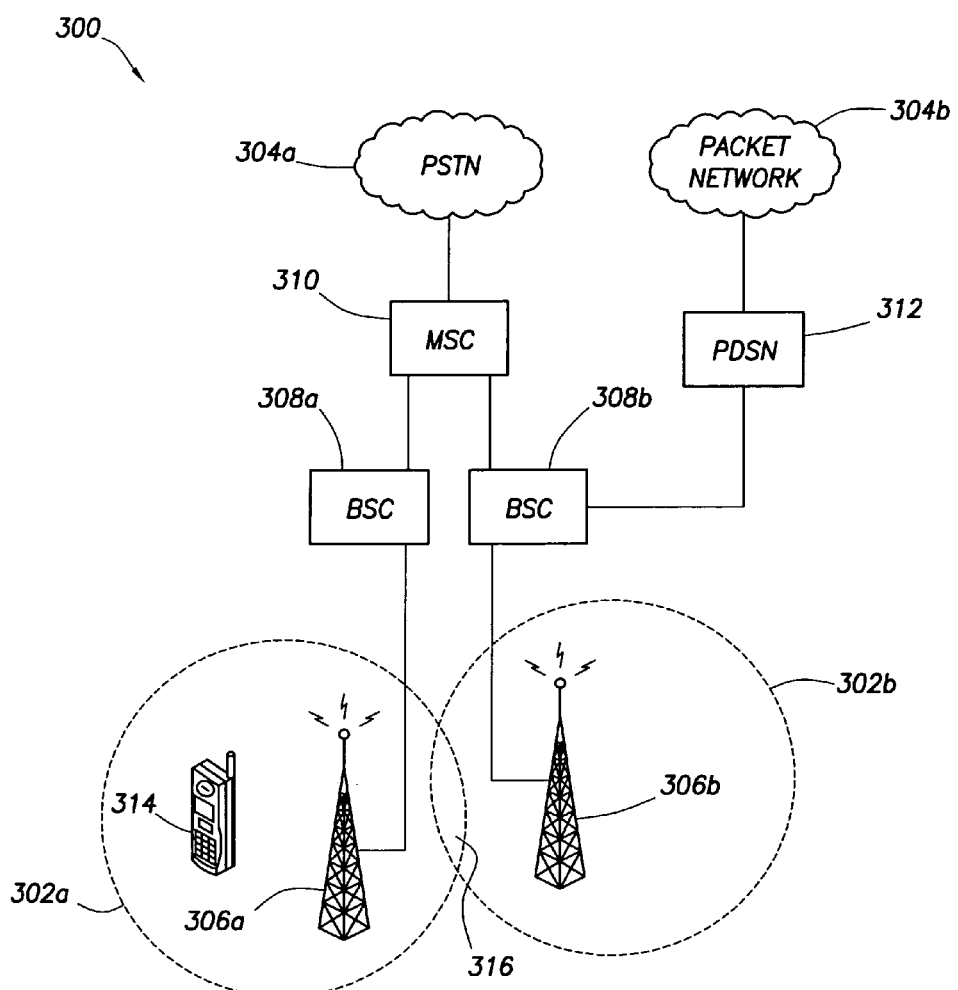
FIG. 3 is a diagram of one embodiment of a wireless network within which a mobile device containing the circuit of FIG. 1 may be used.

Referring to FIG. 3, a communications network 300 illustrates one embodiment of a system within which a mobile device containing the circuit 200 of FIG. 2 may be used. In the present example, the network 300 is a CDMA network that may be compatible with a variety of standards including, but not limited to, Interim Standard 95 (IS-95), Interim Standard 2000 (IS-2000) and Universal Mobile Telecommunications System (UMTS). The network 300 may represent other technologies, including Global System for Mobile communication (GSM), and Orthogonal Frequency Division Multiplexing (OFDM). Accordingly, it is understood that the methods of the present disclosure may be performed in networks based on different technologies, such as High Rate Packet Data-based Radio Access Networks (HRPD-based RANs) and that the examples using a CDMA network are for purposes of illustration only.

The network 300 includes a plurality of cells 302a, 302b. In the present example, the network 300 is a wireless network, and may be connected to other wireless and/or wireline networks, such as a Public Switched Telephone Network (PSTN) 304a and a packet network 304b. Each cell 302a, 302b in the network 300 includes a base station (BS) 306a, 306b, respectively, that are coupled to base station controllers (BSC) 308a, 308b, respectively. A mobile switching center (MSC) 310 may be used to connect the network 300 with other networks such as the PSTN 304a. Although not shown, the base stations 306a and 306b may be coupled to the same BSC, and the BSCs 308a and 308b may be coupled to separate MSCs. The BSC 308b may be coupled to a packet-switched node 312 (e.g., a packet data node such as a packet data serving node (PDSN)) that is coupled to the packet network 304b.

The network 300 enables a mobile device 314 to communicate with another device (not shown) via the BTS 306a associated with the cell 302a in which the mobile device is located. Although illustrated in FIG. 3 as a cellular phone, it is understood that the mobile device 314 may be any portable device capable of wirelessly participating in a communication session, and such devices may include personal digital assistants, portable computers, pagers, and/or cellular phones. The cells 302a, 302b overlap so that the mobile device 314 may travel from one cell to another (e.g., from the cell 302a to the cell 302b) while maintaining a communication session. In a handoff region 316 (e.g., the area where the cells 302a, 302b overlap), the mobile device 314 may be serviced by both the BTS 306a and the BTS 306b. When the mobile device 314 receives a signal, the DC component of the signal may be minimized or eliminated using a circuit contained within the mobile device such as the circuit 200 described with respect to FIG. 2.

Figure 4:
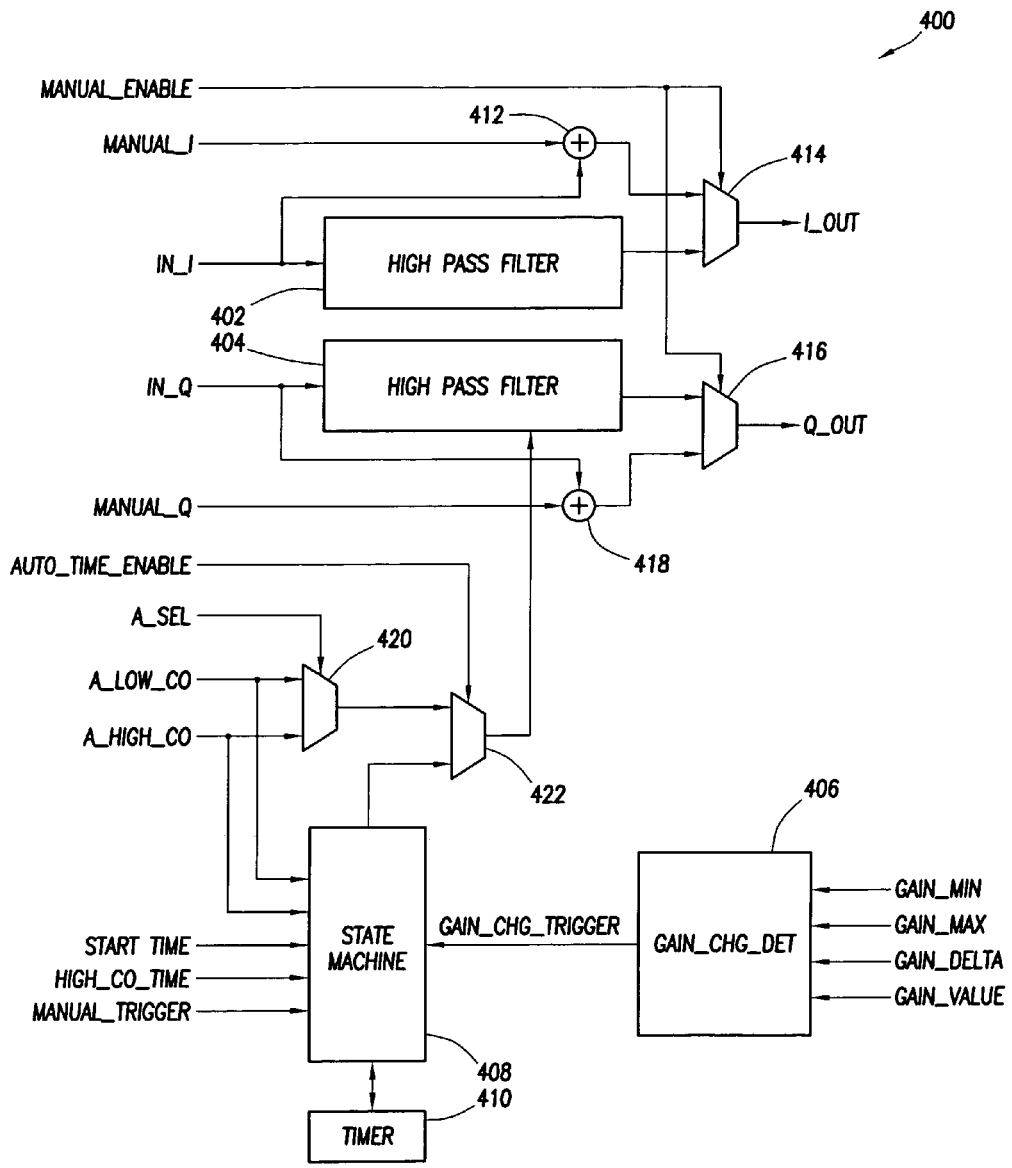
FIG. 4 is a block diagram of one embodiment of a circuit that may be used to correct a DC component of a signal within a mobile device.

Referring to FIG. 4, in one embodiment, a circuit 400 may be used to minimize or eliminate DC offset in a signal received by a mobile device. In the present example, the circuit 400 includes two first order IIR high pass filters 402 and 404 having programmable cutoff frequencies. A circuit GAIN_CHG_DET 406 detects a change in receiver gain. A state machine 408 controls filter cutoff frequency parameters. A timer 410 (e.g., a counter circuit) provides a time base for timer operations. The circuit 400 may also include various other components 412, 414, 416, 418, 420, and 422, such as registers that may be used to set constant parameters and multiplexers that may be used switch the signal path as required.

The received signal may include an in-phase data stream portion and a quadrature data stream portion. The high pass filter 402 may form part of the in-phase signal path and the high pass filter 404 may form part of the quadrature signal path. Input to the high pass filter 402 is in the in-phase signal IN_I. For purposes of example, MANUAL_I may be the digital equivalent of a few microvolts to a few millivolts. Inputs to the high pass filter 404 may include the quadrature signal IN_Q and, optionally, a programmable constant MANUAL_Q. For purposes of example, MANUAL_Q may be the digital equivalent of a few microvolts to a few millivolts. In the present embodiment, the circuit 400 may accept manual DC offset correction commands and bypass the high pass filters 402 and 404. Such commands may be used, for example, if external DC measurement facilities are available that will yield overall improved performance. This manual DC offset correction mode may be enabled via a control MANUAL_ENABLE. When asserted, the circuit 400 will add the value defined by the programmable constant MANUAL_I to the in-phase data stream and likewise add the value defined by the programmable constant MANUAL_Q to the quadrature data stream.

The GAIN_CHG_DET 406 may include multiple inputs GAIN_MIN, GAIN_MAX, GAIN_DELTA, and GAIN_VALUE to determine whether to trigger an output signal GAIN_CHG_TRIGGER. For purposes of example, GAIN_MIN may be 0 dB, GAIN_MAX may be 10 dB, and GAIN_DELTA may be 4 dB. The GAIN_CHG_DET 406 may be used to aid the circuit 400 in compensating for relatively large changes in DC offset due to deliberate gain changes commanded by a host controller of the mobile device. For example, the GAIN_CHG_DET 406 may monitor the receiver gain via the input GAIN_VALUE and detect changes in gain that are of sufficient magnitude and lie on specific points in the gain range. Upon detecting a qualified change, the GAIN_CHG_DET 406 may trigger the state machine 408 via GAIN_CHG_TRIGGER to initiate a timed sequence, as will be described later in greater detail with respect to FIG. 7.

The need to detect a qualified gain change prior to asserting GAIN_CHG_TRIGGER ensures that gain changes of minimal magnitude residing in certain portions of the gain range that can be adequately absorbed by the high pass filters 402 and 404 operating in low cutoff frequency mode will not force the high pass filters to a high cutoff frequency mode, which may have a negative impact on the incoming signal. Accordingly, in the present example, a gain change larger than the value defined by the programmable constant GAIN_DELTA (i.e., GAIN_VALUE(t)−GAIN_VALUE(t−1)>GAIN_DELTA) and whose value lies between the points defined by the programmable constants GAIN_MIN and GAIN_MAX (i.e., GAIN_MIN<GAIN_VALUE<GAIN_MAX) is considered to be a qualified gain change and will trigger GAIN_CHG_TRIGGER.

The state machine 408 may include multiple inputs A_LOW_CO, A_HIGH_CO, START_TIME, HIGH_CO_TIME, MANUAL_TRIGGER, and GAIN_CHG_TRIGGER (from GAIN_CHG_DET 406). A_LOW_CO and A_HIGH_CO are programmable constants that may be used to set the low cutoff frequency and high cutoff frequency, respectively, for the high pass filters 402 and 404. For purposes of example, A_LOW_CO may be 0.995 and A_HIGH_CO may be 0.86. GAIN_CHG_TRIGGER notifies the state machine 408 that a qualified gain change has occurred. START_TIME is a programmable constant that may be used to define a time period used in determining when to switch from A_LOW_CO to A_HIGH_CO. For purposes of example, START_TIME may be two microseconds. The MANUAL_TRIGGER forces the circuit 400 to switch into high cutoff frequency mode for a period of time defined by the programmable constant HIGH_CO_TIME. The value of HIGH_CO_TIME may be chosen to correspond to the time it takes for the largest possible value of DC offset to diminish through the high pass filters 402 and 404, taking into consideration A_HIGH_CO. For purposes of example, HIGH_CO_TIME may be eight microseconds. After the period of time defined by HIGH_CO_TIME, the state machine 408 switches back to low cutoff frequency mode for normal operation. The timer 410 may be used to provide the state machine 408 with timing information needed to identify the expiration of START_TIME and HIGH_CO_TIME.

In some embodiments, the circuit 400 may retain the flexibility to have control of the high pass filter 402 and 404 cutoff frequencies moved to the host controller of the mobile device via two signals, AUTO_TIME_ENABLE and A_SEL. For example, if facilities exist external to the circuit 400 to switch the cutoff frequencies of the high pass filters 402 and 404 in a different way than that provided by the state machine 408, the host controller can de-assert AUTO_TIME_ENABLE and select between one of two cutoff frequencies defined by A_LOW_CO and A_HIGH_CO with timing that is independent of any constants within the circuit 400. It can be seen that the high pass filter 402 and 404 cutoff frequencies A_LOW_CO and A_HIGH_CO may be manipulated in a variety of ways and may be set to any number of different cutoff frequency settings over a period of time through the use of A_LOW_CO, A_HIGH_CO, and A_SEL. This complex control may be achieved, for example, by software on the host controller or elsewhere.

Figure 5:
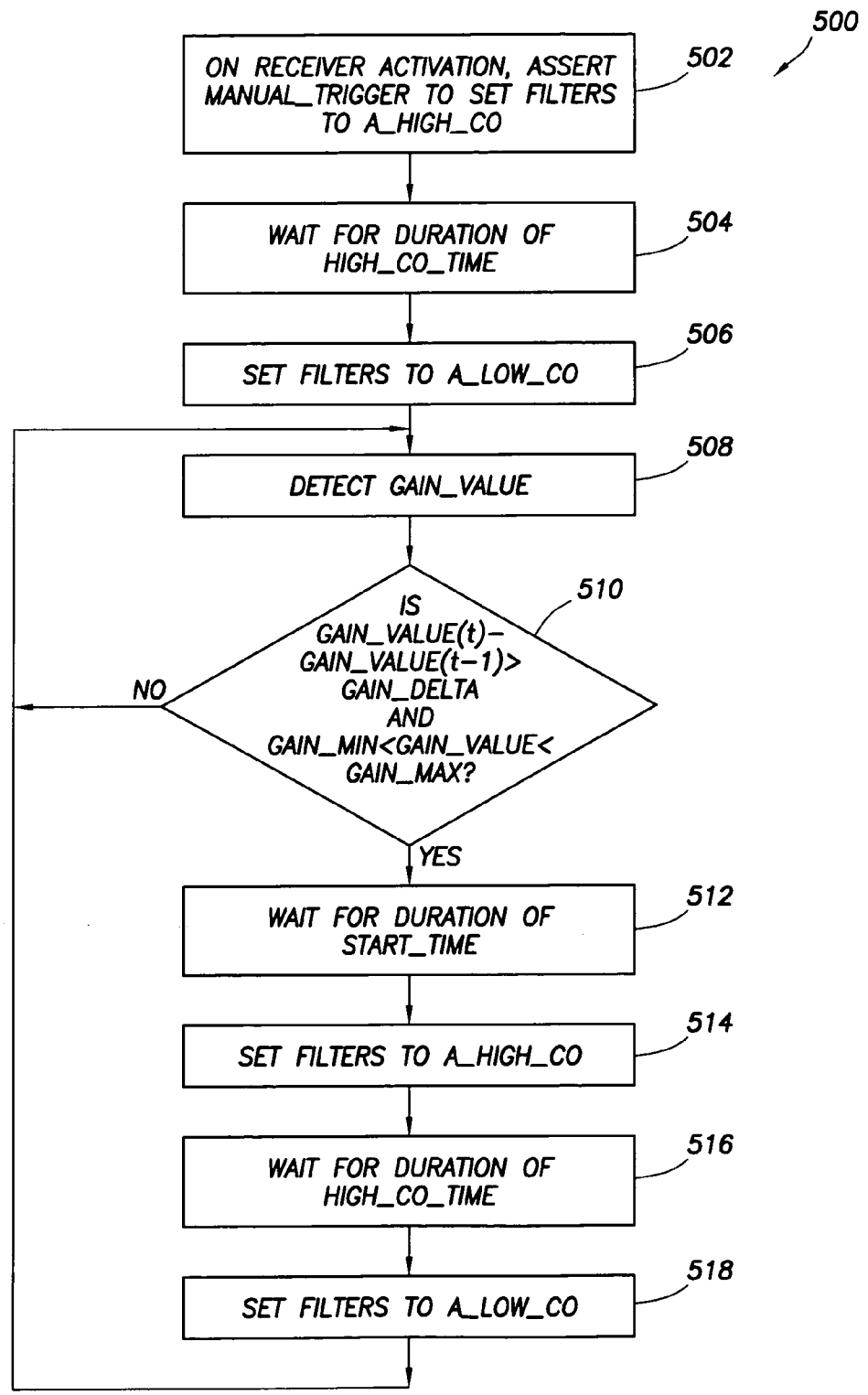
FIG. 5 is a flowchart illustrating one embodiment of a method for correcting a DC component of a signal using the circuit of FIG. 4.

With additional reference to FIG. 5, a method 500 may be executed to use the circuit 400 of FIG. 4 to minimize or eliminate DC offset in a received signal. This aids the circuit 400 in handling DC offset changes by switching the cutoff frequencies of the high pass filters 402 and 404 at precise times between a relatively high value defined by the programmable constant A_HIGH_CO and a relatively low value defined by the programmable constant A_LOW_CO.

In step 502, upon activation of the mobile device receiver, the method 500 begins an initial fast convergence timing sequence as the state machine 408 triggers MANUAL_TRIGGER and sets the filters 402 and 404 to A_HIGH_CO. In the present example, this sequence may be initiated immediately following the activation of the receiver as a part of the mobile device's normal operation. It is understood that the filters 402 and 404 may default to A_LOW_CO upon activation and so need to be set to A_HIGH_CO, or MANUAL_TRIGGER may be used to ensure that the filters are set to A_HIGH_CO regardless of their initial settings.

Figure 6:
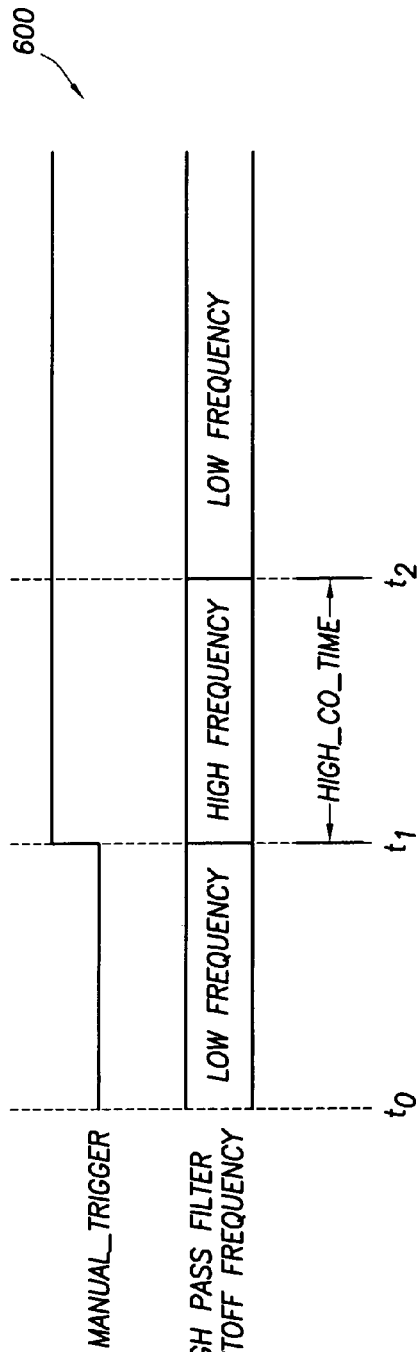
FIG. 6 is a timing sequence illustrating one possible sequence of states within the circuit of FIG. 4.

With additional reference to FIG. 6, a timing sequence 600 begins at time t0 with the circuit 400 in low cutoff frequency mode (e.g., upon receiver activation and prior to step 502). As stated previously, the assertion of MANUAL_TRIGGER (time $t_1$ of FIG. 6) forces a switch into high cutoff frequency mode for a period of time defined by the programmable constant HIGH_CO_TIME. In the present example, the switch to A_HIGH_CO occurs immediately after the assertion of MANUAL_TRIGGER, but it is understood that a delay may be included between the assertion of MANUAL_TRIGGER and the switch to A_HIGH_CO.

In step 504, the method 500 may wait for the duration of time defined by HIGH_CO_TIME. The filters 402 and 404 are then set to A_LOW_CO in step 506 (time $t_2$ of FIG. 6) to switch the circuit 400 to low cutoff frequency mode for normal operation.

While the low cutoff frequency normal operation mode is sufficient to track and correct small changes in DC offset caused by varying temperature, voltage and RF impairments, relatively large changes in DC offset (e.g., due to deliberate gain changes commanded by the host controller) need to be handled by the circuit 400. The GAIN_CHG_DET 406 may be used to identify qualified changes in DC offset that should be addressed by the state machine 408. Accordingly, in step 508, the GAIN_CHG_DET 406 detects the present gain value GAIN_VALUE and, in step 510, makes a determination as to whether GAIN_VALUE represents a qualified gain change.

In the present embodiment, if GAIN_VALUE(t)−GAIN_VALUE(t−1)>GAIN_DELTA and GAIN_MIN<GAIN_VALUE<GAIN_MAX, then the method 500 continues to step 512. Otherwise, the method 500 returns to step 508 to detect a new GAIN_VALUE and a determination is made in step 510 as to whether any gain change associated with the new GAIN_VALUE is qualified. It is understood that steps 508 and 510 may repeat until a qualified gain change is detected or the receiver is deactivated.

Figure 7:
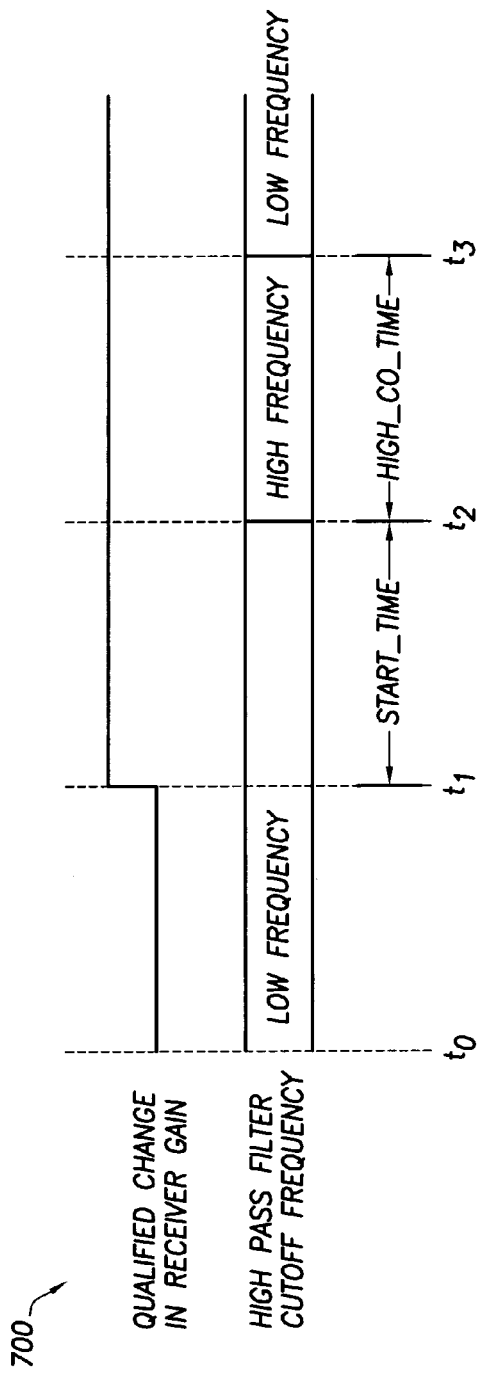
FIG. 7 is a timing sequence illustrating one possible sequence of states within the circuit of FIG. 4.

With additional reference to FIG. 7, a timing sequence 700 begins at time to with the circuit 400 in low cutoff frequency mode (e.g., following step 506). If GAIN_VALUE represents a qualified gain change (time $t_1$ of FIG. 7), the method 500 waits for the duration of START_TIME in step 512. The programmable delay provided by START_TIME may allow the DC component to stabilize and propagate through the receiver chain to the point in the chain where the circuit 400 is located. The value of START_TIME may be determined by knowledge of the receiver architecture and the anticipated DC behavior in the presence of receiver gain changes, although other methods for calculating START_TIME may be used.

In step 514, after START_TIME expires (time $t_2$ of FIG. 7), the filters 402 and 404 are set to A_HIGH_CO. In step 516, the method 500 waits for the duration defined by A_HIGH_TIME before setting the filters back to A_LOW_CO in step 518 (time $t_3$ of FIG. 7).

It is understood that while two cutoff frequencies (e.g., A_LOW_CO and A_HIGH_CO) are used for purposes of example, multiple cutoff frequencies may be implemented. For example, rather than configuring the circuit 400 to use a single high cutoff frequency, a particular high cutoff frequency may be selected from multiple possibilities based on the amount of gain change detected by GAIN_CHG_DET 406. To achieve this, a static mechanism (e.g., a look up table) may be implemented containing various gain change values or ranges and corresponding high cutoff frequencies, or a cutoff frequency may be dynamically calculated based on the gain change value. Similarly, a static or dynamic mechanism may be implemented to provide for the use of multiple low cutoff frequencies. Accordingly, different levels of precision may be provided for tuning the filters 402 and 404. Furthermore, although first order IIR filters are used to describe aspects of the present invention, it is understood that other filters may be used, including higher order filters and other non-linear filter types may be used.

In addition, other time periods may be introduced if desired. For example, a time period may be defined after step 518 of FIG. 5 to ensure that the circuit 400 does not immediately detect another qualified gain change and attempt to switch back to A_HIGH_CO. Alternatively, the value of START_TIME may be calculated to include a desired wait period even if another qualified gain change is immediately detected.

While the methods described herein are illustrated as being circuit based, it is understood that some or all steps may be configured in software. For example, software instructions may be stored in memory and executed by the host controller of a mobile device. The software instructions may enable the host controller to detect gain changes, modify filter behavior (e.g., set the cutoff frequency to a low cutoff frequency or a high cutoff frequency), and perform the various other functions described herein to enable the mobile device to dynamically minimize or eliminate DC offset in the receive chain.

Although only a few exemplary embodiments of this disclosure have been described in details above, those skilled in the art will readily appreciate that many modifications are possible in the exemplary embodiments without materially departing from the novel teachings and advantages of this disclosure. Also, features illustrated and discussed above with respect to some embodiments can be combined with features illustrated and discussed above with respect to other embodiments. For example, various steps from different flow charts may be combined, performed in an order different from the order shown, or further separated into additional steps. Furthermore, steps may be performed by network elements other than those disclosed. Accordingly, all such modifications are intended to be included within the scope of this disclosure.

What is claimed is:

1. A method comprising:
   setting a cutoff frequency of a filter coupled to a mobile device receiver at a first frequency, wherein a signal entering the filter is attenuated based on the cutoff frequency;
   detecting whether a qualified change has occurred in a direct current (DC) component of the signal;
   setting the cutoff frequency at a second frequency for a first defined time period if a qualified change has occurred, wherein the second frequency attenuates more of the signal than the first frequency; and
   setting the cutoff frequency to a third frequency after the first defined time period ends, wherein the third frequency attenuates less of the signal than the second frequency.

2. The method of claim 1 further comprising, after detecting the qualified change, waiting for a second defined time period before setting the cutoff frequency to the second frequency.

3. The method of claim 1 further comprising, upon activation of the receiver, setting the cutoff frequency at the second frequency for the first defined time period without detecting the qualified change.

4. The method of claim 1 wherein detecting the qualified change includes:
   detecting a present gain of the receiver;
   determining whether the present gain satisfies at least one change parameter; and
   identifying an occurrence of a qualified change if the present gain satisfies the at least one change parameter.

5. The method of claim 1 further comprising selecting the second cutoff frequency from a plurality of second cutoff frequencies.

6. The method of claim 1 wherein the first and third cutoff frequencies are identical.

7. A method comprising:
   setting at least one filter to a low cutoff frequency setting, wherein the low cutoff frequency setting attenuates a portion of a signal received by a wireless receiver;
   determining whether a qualified change has occurred to a direct current (DC) component of the signal;
   waiting for a first predefined period of time if a qualified change has occurred;
   setting the at least one filter to a high cutoff frequency setting after the first predefined period of time has expired, wherein the high cutoff frequency setting attenuates a larger portion of the signal than the low cutoff frequency setting;
   waiting for a second predefined period of time after setting the at least one filter to the high cutoff frequency setting; and
   setting the at least one filter to the low cutoff frequency setting after the second predefined period of time has expired.

8. The method of claim 7 wherein determining whether the qualified change has occurred includes:

detecting a gain value; and determining whether the gain value satisfies a predefined change parameter, wherein a qualified change has occurred if the gain value satisfies the predefined change parameter.

9. The method of claim 8 wherein determining whether the gain value satisfies the predefined change parameter includes:

comparing a change in gain value to a predefined gain change value; and comparing the gain value to a minimum gain value and maximum gain value.

10. The method of claim 9 wherein the gain value satisfies the predefined change parameter if the change in gain value is larger than the predefined gain change value and the gain value is larger than the minimum gain value and smaller than the maximum gain value.

11. The method of claim 7 further comprising, upon activation of the receiver, setting the at least one filter to the high cutoff frequency setting for the second predefined period of time without first determining whether the qualified change has occurred.

12. A system comprising:

at least one filter for attenuating a signal received by a mobile device receiver based on a programmable cutoff frequency;

a direct current (DC) change detector configured to monitor a DC component of the signal and send an output signal if a change in the DC component meets at least one programmable criterion; and a state machine coupled to the at least one filter and the DC change detector, wherein the state machine is configured to set the programmable cutoff frequency to a first cutoff value or a second cutoff value based on the output signal of the DC change detector, wherein the first cutoff value attenuates less of the signal than the second cutoff value.

13. The system of claim 12 wherein the state machine is configured to set the programmable cutoff frequency to the second cutoff value if the output signal of the DC change detector indicates that the change in the DC component meets the at least one programmable criterion.

14. The system of claim 13 wherein the state machine is configured to wait for a predefined period of time prior to setting the programmable cutoff frequency to the second cutoff value.

15. The system of claim 13 wherein the state machine is configured to wait for a predefined period of time after setting the programmable cutoff frequency to the second cutoff value, and then set the programmable cutoff frequency to the first cutoff value after the predefined period of time expires.

16. A system for use with a wireless receiver comprising:

at least one filter having a programmable cutoff frequency;

a direct current (DC) gain change detector having inputs including a gain value and at least one programmable change parameter and an output including a change trigger;

a state machine coupled to the filter and the DC gain change detector, wherein the state machine has inputs including a first time period, a low cutoff frequency value, a high cutoff frequency value, and the change trigger, and an output for setting the programmable cutoff frequency to the low or high cutoff frequency value; and a plurality of executable instructions for:

setting the programmable cutoff frequency to the low cutoff frequency value, wherein the low cutoff frequency value attenuates a portion of a signal received by the receiver;

asserting the change trigger if a qualified change has occurred to a DC component of the signal based on the at least one programmable change parameter;

setting the programmable cutoff frequency to the high cutoff frequency value for the first time period after the change trigger is asserted, wherein the high cutoff frequency value attenuates a larger portion of the signal than the low cutoff frequency value; and setting the programmable cutoff frequency to the low cutoff frequency value after the first time period has expired.

17. The system of claim 16 wherein a timing circuit coupled to the state machine enables the state machine to identify when the first time period has expired.

18. The system of claim 16 wherein the signal includes an in-phase data stream portion and a quadrature data stream portion, and wherein the at least one filter includes a first high pass filter positioned to filter the in-phase data stream portion and a second high pass filter positioned to filter the quadrature data stream portion.

19. The system of claim 18 wherein the first and second filters are infinite impulse response (IIR) filters.

20. The system of claim 18 further comprising instructions for sending a bypass signal to bypass the first and second filters.

21. The system of claim 20 wherein the bypass signal causes a first programmable constant to be summed with the in-phase data stream portion of the signal and a second programmable constant to be summed with the quadrature data stream portion of the signal.

22. The system of claim 16 further comprising instructions for sending a bypass signal to select at least one of the low cutoff frequency value and high cutoff frequency values independent of whether a qualified change has occurred.

23. The system of claim 16 further comprising instructions for waiting for a second time period after the change trigger is asserted and before setting the programmable cutoff frequency to the high cutoff frequency value for the first time period.

* * * * *